Dec. 10, 1968 M. GENSER ET AL 3,414,968
METHOD OF ASSEMBLY OF POWER TRANSISTORS
Filed Feb. 23, 1965

PRIOR ART

MILTON GENSER
PERRY C. SMITH
INVENTORS

BY S. A. Giarratana
F. L. Masselle

ATTORNEY

United States Patent Office 3,414,968
Patented Dec. 10, 1968

3,414,968

METHOD OF ASSEMBLY OF POWER TRANSISTORS

Milton Genser, Livingston, and Perry C. Smith, Englewood, N.J., assignors, by mesne assignments, to Solitron Devices, Inc., a corporation of New York Filed Feb. 23, 1965, Ser. No. 434,245
5 Claims. (Cl. 29—577)

ABSTRACT OF THE DISCLOSURE

There is described a method of making a semiconductor, e.g. micro-size, silicon type planar power transistor for incorporation into a micro-circuit. The steps comprise: creating the desired component e.g. transistor out of semiconductor material in the center of a chip of such material by oxide masking and diffusion, creating lands of electrically conductive material on the periphery of the chip and connecting the active regions of the component by depositing a metal film to the lands, and forming corresponding lands on a thin film circuit surface. The semiconductor chip with the formed component is then inverted and the semiconductor chip is fused to the thin film circuit surface with a fusible preform to render the semiconductor chip in contact with one side of the thin film circuit surface.

The present invention relates to power transistors, and more particularly to micro-size, silicon-type planar power transistors for incorporation in circuits of equally small, almost microscopic components.

At present, transistors for such circuits are made in the form of silicon chips or wafers with a metal heat sink at the bottom of the transistor. A power transistor which is to supply any quantity of useful operational output tends to develop considerable heat at the base-collector junction, and, as in all similar power devices, this heat must be removed efficiently. In certain cases, a fair amount of cooling can be provided by a heat exchange system using convection of cooling fluids, e.g., air. However, in certain applications, e.g., in space vehicles, it is impossible or impractical to cool the electronic unit with air, blowers, etc. The active region of the device consisting of the emitter and collector p-n junctions are produced by diffusion within a few ten-thousandths of an inch from the top surface. Thus, the major source of heat, the base-collector p-n junction is separated from the heat sink by two to four-thousandths of an inch of silicon which is a relatively poor conductor of heat.

Although attempts may have been made to provide micro-sized power transistors with a more efficient arrangement for removing the heat, none, as far as we are aware, were ever successfully put into practice.

The present invention contemplates a more efficient arrangement for removing the heat created so as to supply more power with a micro-size transistor without destroying the circuit because of excess heat.

The invention as well as the objects and advantages thereof will become more apparent from the following description when taken in conjunction with the accompanying drawing, in which.

Figure 1:
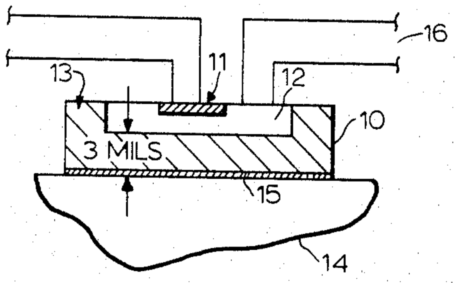
FIG. 1 shows a sectional view of a silicon power transistor of the prior art.

Shown in FIG. 1 is a silicon-type transistor wafer 10 of the prior art with the emitter 11 at the center of the wafer, the base region 12 adjacent thereto and the collector region 13 adjacent the base. Wafer 10 is bonded to a Kovar tab heat sink 14 by means of a gold brazing alloy 15. As can be seen in FIG. 1, the base and collector p-n junction is separated from the heat sink about 3 mils. Leads 16 reach the transistor electrodes over the wafer.

Figure 2:
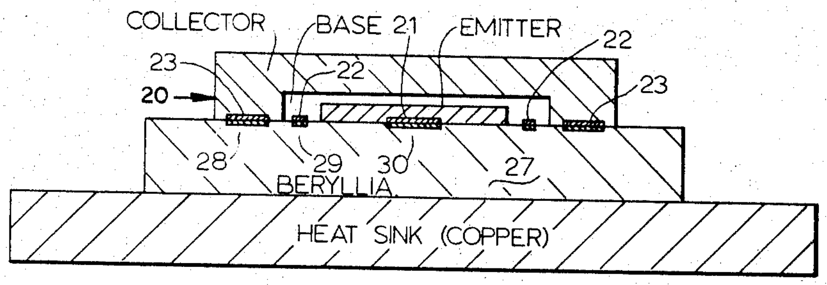
FIG. 2 illustrates a sectional view of the improved silicon power transistor contemplated herein.
Figure 3:
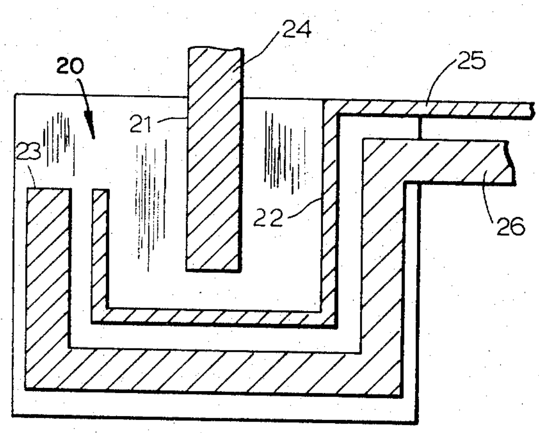
FIG. 3 presents a top view of the transistor shown in FIG. 2.

In the arrangement contemplated herein, a silicon chip 20 is inverted as shown in FIG. 2. This provides considerable improvement in the power handling capability of the device. The active regions of the device are connected by means of deposited metal films 21, 22 and 23, as better shown in FIG. 3, to metal lands 24, 25 and 26, deposited on the silicon oxide layer of the device at the periphery of the chip or wafer 20. The active regions of the device are then covered with a non-organic protecting layer such as silicon monoxide. The unit is then attached to a beryllia, i.e., beryllium oxide chip 27 which has deposited thereon metal lands 28, 29, 30 which register with the lands 24, 25, 26 on the silicon chip 20. The attachment is accomplished by use of a fusible metal preform which wets the lands on the chip and the lands on the substrate. One such alloy preform would consist of between about 80 parts to about 90 parts lead, between about 3 to about 5 parts silver, and between about 5 to about 17 parts tin; the alloy melting at 311° C. During the fusion process, the silicon chip is contacted to one side of the beryllia substrate surface in such a manner that heat conducting columns are formed to the beryllia surface. This beryllia chip can be previously brazed to the power transistor case. The electrodes can also be bonded to glass or other suitable high thermal conductivity and electrically insulative material. The foregoing arrangement provides a much shorter heat path from the heat generating junction to a copper heat sink which is in contact with the other side of the beryllia surface.

For the purpose of giving those skilled in the art a better appreciation of the invention, the following illustrative example is given:

*Example*

A unit was fabricated and mounted in the conventional way as shown in FIG. 1, while a similar unit was mounted as shown in FIG. 2. In the unit mounted as in FIG. 1, the junction temperature reached 200° C. at a power level of .8 watt. In the unit mounted as in FIG. 2, the junction temperature of one watt was not reached at a power level over one watt, i.e., the temperature did not change one joule per second. A life test of the power transistor mounted as in FIG. 2 has shown over 600 hours of life at 200, 400 and 500 milliwatts power loading at 25° C. ambient environment without failures. Step stress testing has demonstrated no failure up to one watt of power.

It is to be observed, therefore, that the present invention provides for the fabrication of thin film circuits in which at least one heat creating semiconductor component is built into the center of a chip by the usual process of diffusion and oxide masking. The active regions of the device are connected by a deposited metal film to lands which are deposited on the periphery of the chip. The chip is then inverted and the metal lands on the chip are fused to corresponding lands on the thin film circuit by a fusible preform. Preferably, such a preform consists of between about 80 to about 90° parts lead, between about 3 to about 5 parts silver, and between about 5 to about 17 parts tin.

While there has been described what at present is believed to be the preferred embodiment of this invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A method of making a semiconductor micro-circuit, comprising the steps of:

creating a desired component out of semiconductor material in the center of a chip of such material by oxide masking and diffusion;

creating lands of electrically conductive material on the periphery of the chip and connecting the active regions of the component so formed by depositing a metal film to said lands;

forming corresponding lands on one surface of a thin film circuit means;

inverting said semiconductor chip with the formed component and fusing said semiconductor chip to said one surface of said thin film circuit means with a fusible preform, said thin film circuit means comprising high thermal conductivity electrically insulative material; including the step of rendering the opposite surface of said thin film circuit means in contact with a heat sink.

2. The method of claim 1, said preform being an alloy comprising between about 80 to 90 parts of lead, between about 3 to about 5 parts of silver and between about 5 to about 17 parts of tin.

3. The process of claim 1 wherein said thin film circuit means comprises a beryllia chip.

4. The process of claim 1, wherein the active regions of said formed semiconductor component are covered with silicon monoxide.

5. The process of claim 1 wherein said opposite surface of said semiconductor means is rendered in contact with a heat sink comprising a case for said component.

References Cited

UNITED STATES PATENTS

| | | | |
|---|---|---|---|
| 3,065,534 | 11/1962 | Marino | 29—501 X |
| 3,138,744 | 6/1964 | Kilby. | |
| 3,184,329 | 5/1965 | Burns. | |
| 3,055,099 | 9/1962 | Plust | 29—501 |
| 3,158,788 | 11/1964 | Last | 317—101 |
| 3,256,465 | 6/1966 | Weissenstern | 317—101 |
| 3,271,625 | 9/1966 | Caracciolo | 317—101 |
| 3,289,046 | 11/1966 | Carr | 317—101 |
| 3,292,240 | 12/1966 | McNutt | 29—577 |
| 3,292,241 | 12/1966 | Carroll | 29—504 X |

OTHER REFERENCES

IBM Technical Disclosure Bulletin, vol. 3, No. 12, May 1961; pp. 30 and 31.

WILLIAM I. BROOKS, *Primary Examiner*.

U.S. Cl. X.R.

29—589, 588; 317—235